(12) United States Patent
Gill

(10) Patent No.: US 6,613,380 B1
(45) Date of Patent: Sep. 2, 2003

(54) METHOD OF MAKING ANTIPARALLEL (AP) PINNED SPIN VALVE SENSOR WITH SPECULAR REFLECTION OF CONDUCTION ELECTRONS

(75) Inventor: Hardayal Singh Gill, Portola Valley, CA (US)

(73) Assignee: Hitachi Global Storage Technologies Netherlands B.V., Amsterdam (NL)

(*) Notice: Subject to any disclaimer, the term of this patent is extended or adjusted under 35 U.S.C. 154(b) by 306 days.

(21) Appl. No.: 09/641,246

(22) Filed: Aug. 17, 2000

Related U.S. Application Data

(62) Division of application No. 09/188,828, filed on Nov. 9, 1998, now Pat. No. 6,181,534.

(51) Int. Cl.[7] .................................................. B05D 5/12
(52) U.S. Cl. ........................ 427/131; 427/132; 427/128
(58) Field of Search ................................ 427/127, 132; 360/113

(56) References Cited

U.S. PATENT DOCUMENTS

| | | | | |
|---|---|---|---|---|
| 5,198,948 A | * | 3/1993 | Stover et al. | 360/124 |
| 5,492,605 A | * | 2/1996 | Pinarbasi | 204/192.11 |
| 5,573,809 A | * | 11/1996 | Nix et al. | 427/123 |
| 5,701,222 A | * | 12/1997 | Gill et al. | 360/113 |
| 5,701,223 A | * | 12/1997 | Fontana, Jr. et al. | 360/113 |
| 5,998,016 A | * | 12/1999 | Sasaki | 360/113 |
| 6,181,534 B1 | * | 1/2002 | Gill | 360/324.11 |

* cited by examiner

Primary Examiner—Brian K. Talbot
(74) Attorney, Agent, or Firm—Ervin F. Johnston

(57) ABSTRACT

A specular reflecting layer is employed only one side of an AP pinned layer since a ruthenium (Ru) spacer layer in the AP pinned layer blocks conduction electrons. On the same side of the AP pinned layer a second pinned layer may be employed. With this arrangement the specular reflection layer reflects conduction electrons for enhancing a giant magnetoresistive (GMR) effect.

25 Claims, 13 Drawing Sheets

(ABS)

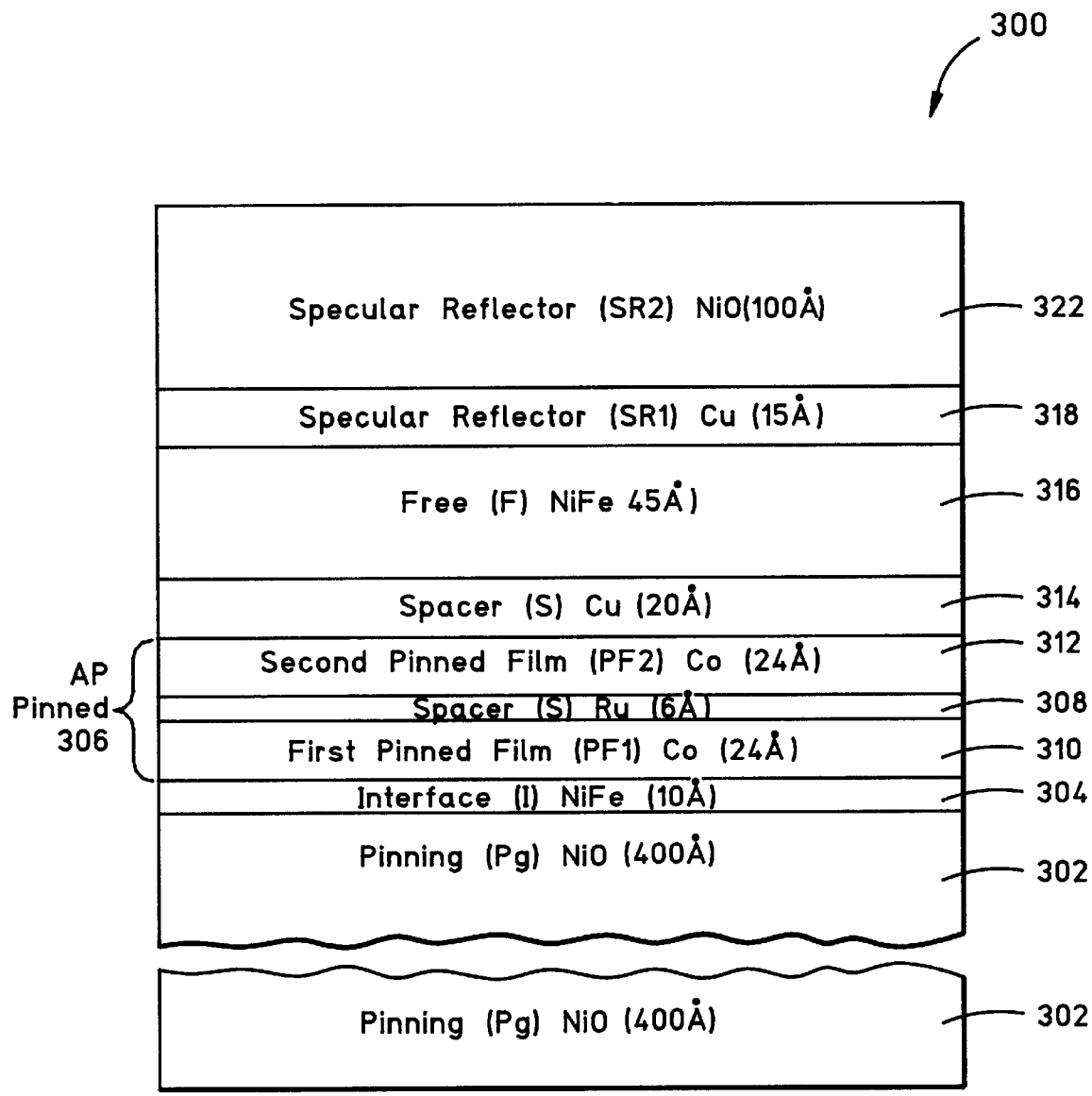
FIG. 9 (ABS)

FIG. 11 (ABS)

FIG. 13 (ABS)

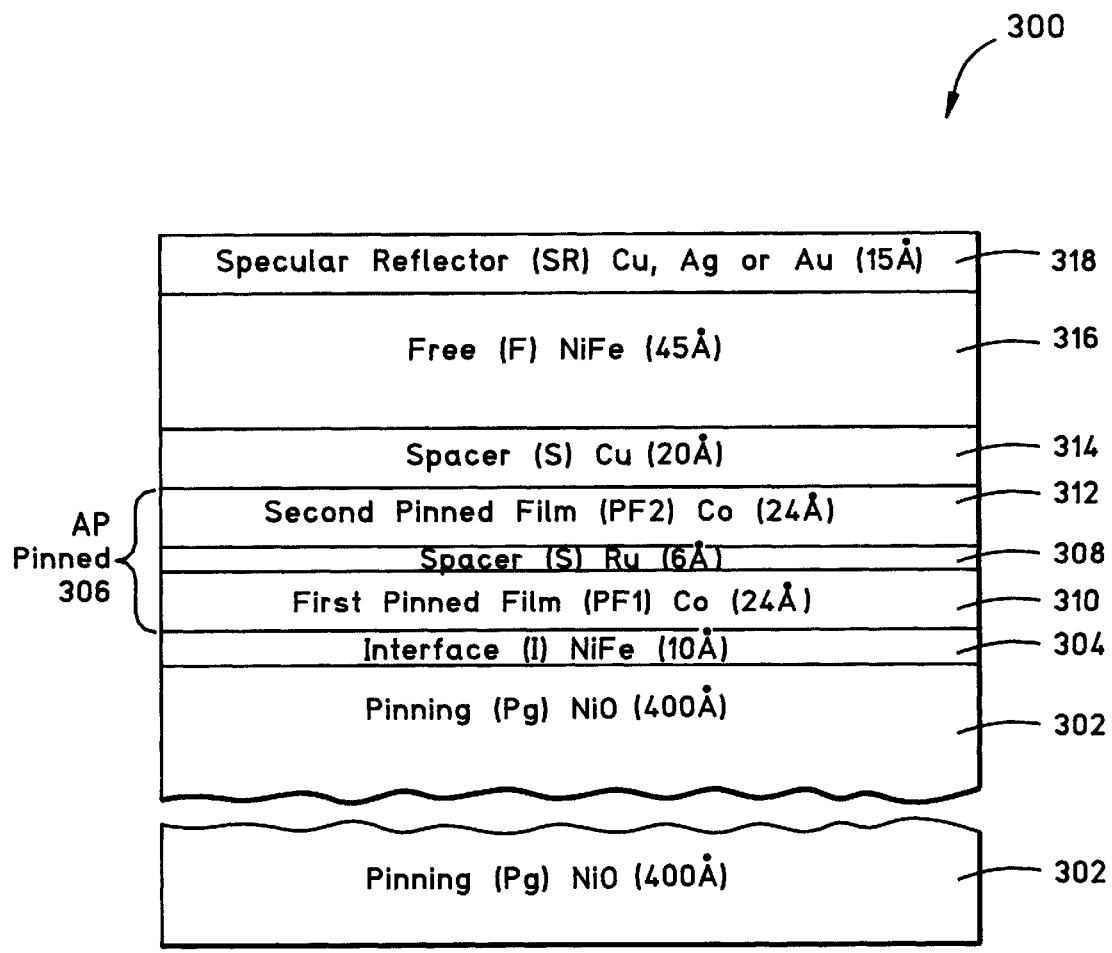
FIG. 15 (ABS)

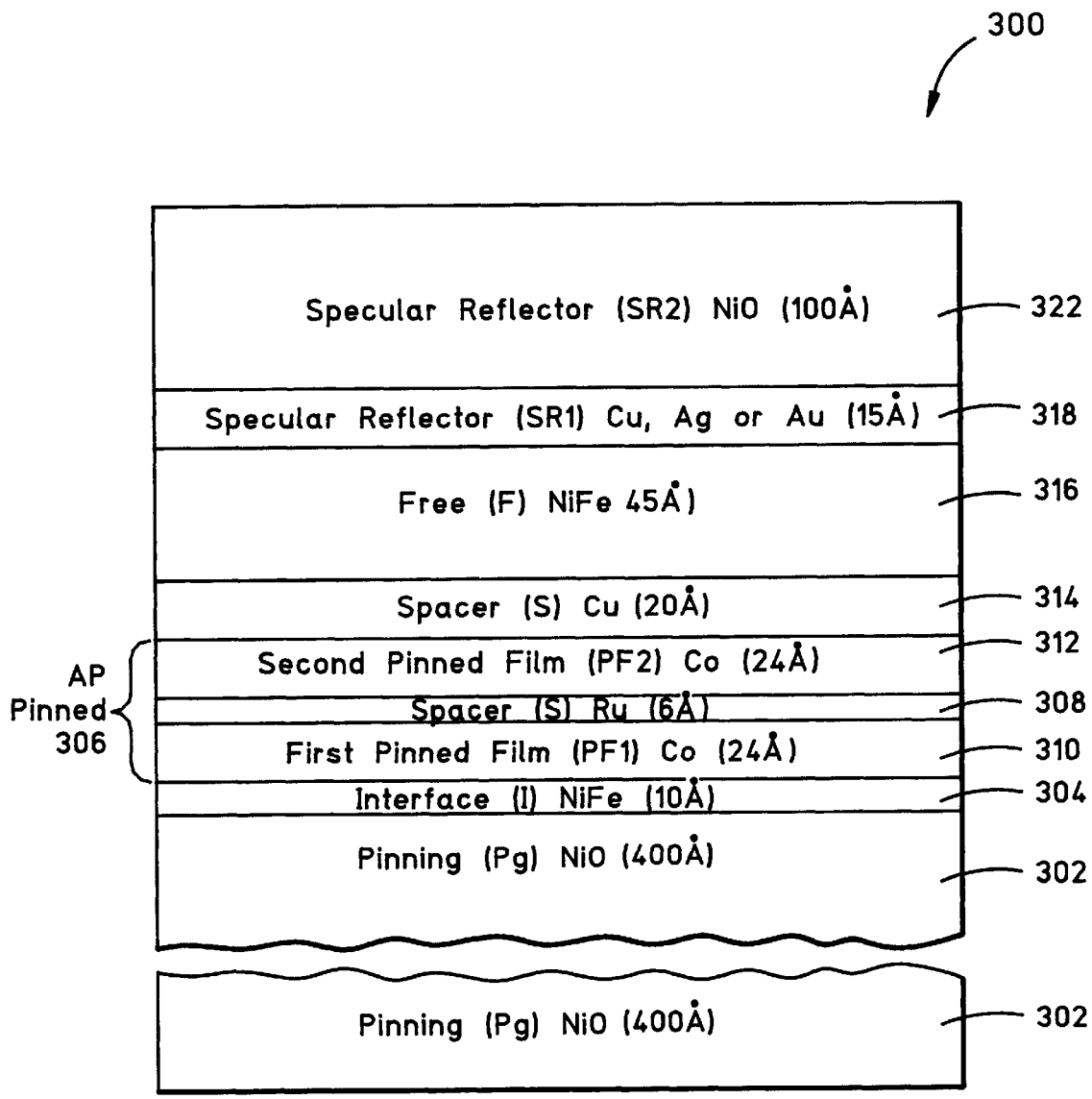
FIG. 16 (ABS)

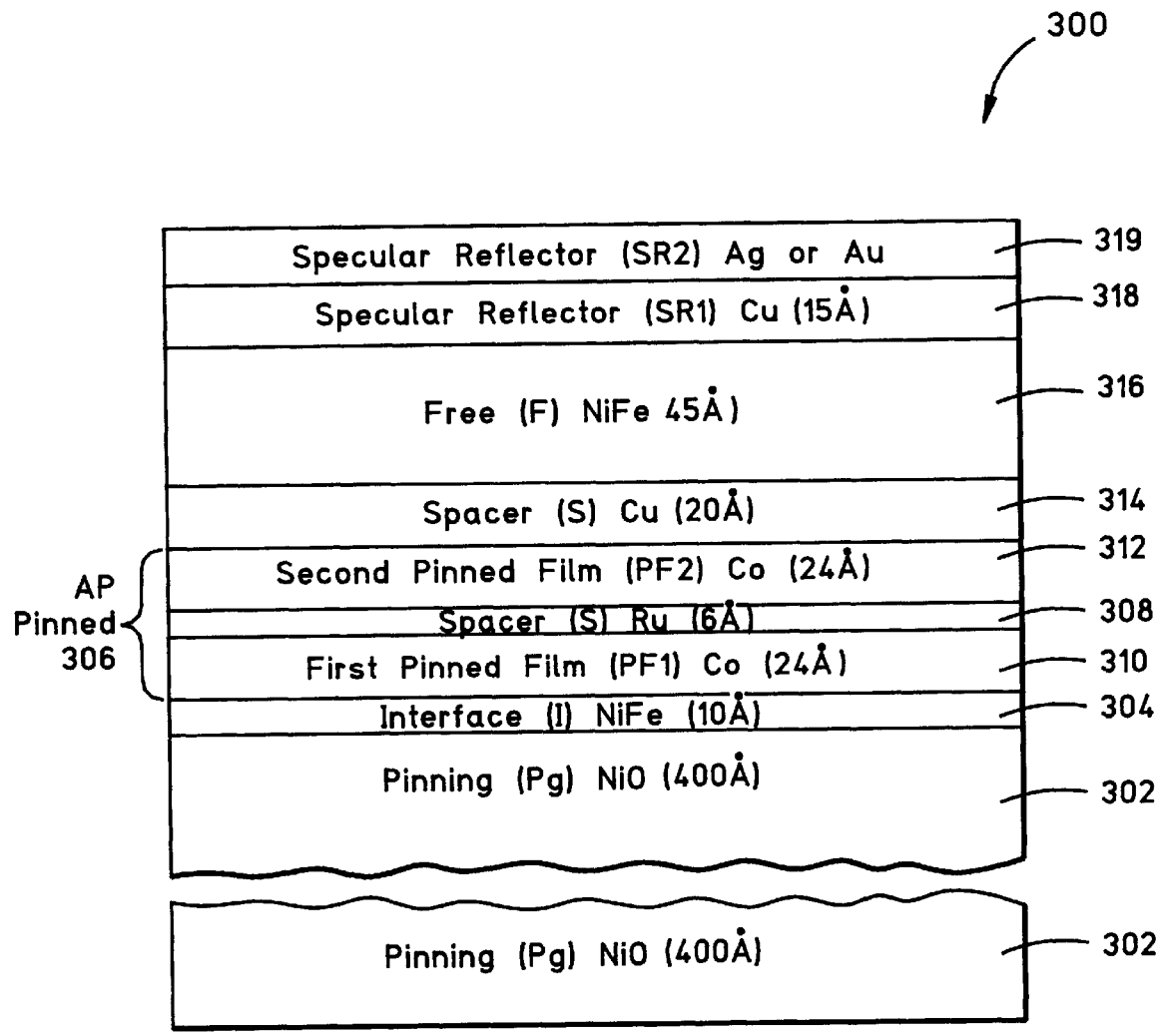
FIG. 17 (ABS)

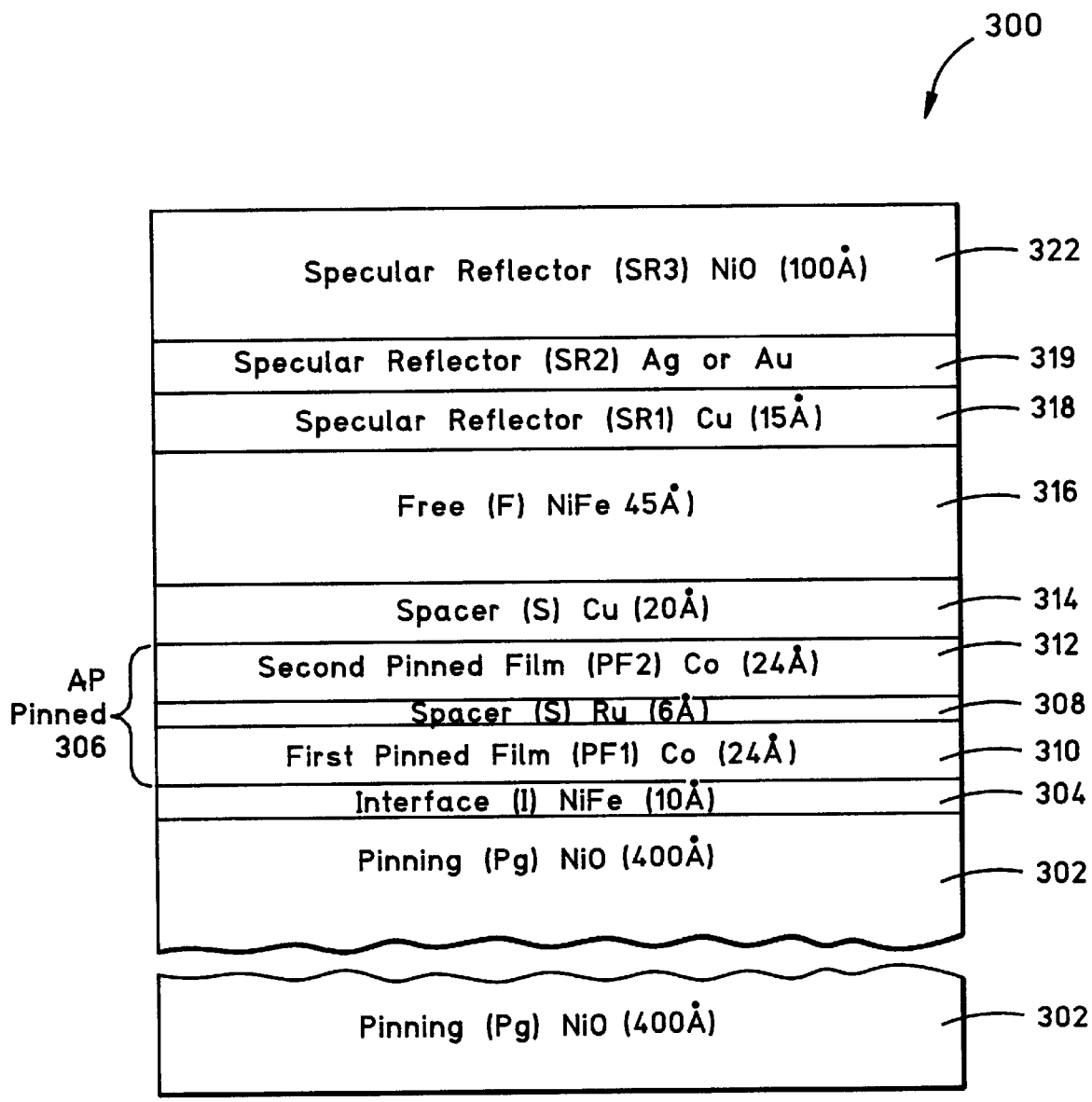
FIG. 18 (ABS)

METHOD OF MAKING ANTIPARALLEL (AP) PINNED SPIN VALVE SENSOR WITH SPECULAR REFLECTION OF CONDUCTION ELECTRONS

REFERENCE TO RELATED APPLICATION

This is a divisional application of application Ser. No. 09/188,828 filed Nov. 9, 1998 now U.S. Pat. No. 6,181,534.

BACKGROUND OF THE INVENTION

1. Field of the Invention

The present invention relates to an antiparallel (AP) pinned spin valve sensor with specular reflection of conduction electrons and, more particularly, to an AP pinned spin valve sensor where a specular reflecting layer reflects conduction electrons to a free layer of the sensor.

2. Description of the Related Art

A spin valve sensor is employed by a read head for sensing magnetic fields from moving magnetic media, such as a magnetic disk or a magnetic tape. The sensor includes a nonmagnetic conductive layer, hereinafter referred to as a spacer layer, sandwiched between first and second ferromagnetic layers, hereinafter referred to as a pinned layer, and a free layer. First and second leads, connected to the spin valve sensor, conduct a sense current therethrough. The magnetization of the pinned layer is pinned 90° to the magnetization of the free layer and the magnetization of the free layer is free to respond to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with the pinned and free layers. When the magnetizations of the pinned and free layers are parallel with respect to one another, scattering is minimal and when the magnetizations of the pinned and free layers are antiparallel, scattering is maximized. Changes in scattering alter the resistance of the spin valve sensor in proportion to $\cos \theta$, where $\theta$ is the angle between the magnetizations of the pinned and free layers. A spin valve sensor is characterized by a magnetoresistive (MR) coefficient that is substantially higher than the MR coefficient of an anisotropic magnetoresistive (AMR) sensor. For this reason a spin valve sensor is sometimes referred to as a giant magnetoresistive (GMR) sensor.

A read head employing a spin valve sensor (hereinafter referred to as a "spin valve read head") may be combined with an inductive write head to form a combined. magnetic head. In a magnetic disk drive, an air bearing surface (ABS) of the combined magnetic head is supported adjacent a rotating disk to write information on or read information from the disk. Information is written to the rotating disk by magnetic fields which fringe across a gap between the first and second pole pieces of the write head. In a read mode the resistance of the spin valve sensor changes proportionally to the magnitudes of the magnetic fields from the rotating disk. When a sense current is conducted through the spin valve sensor, resistance changes cause potential changes that are detected and processed as playback signals.

An improved spin valve sensor, which is referred to hereinafter as an antiparallel (AP) pinned spin valve sensor, is described in commonly assigned U.S. Pat. No. 5,465,185 to Heim and Parkin which is incorporated by reference herein. The AP pinned spin valve sensor differs from a single pinned layer spin valve sensor, described above, in that the pinned layer of the AP pinned spin valve sensor comprises multiple thin films, which are collectively referred to as an antiparallel (AP) pinned layer. The AP pinned layer has a nonmagnetic spacer film sandwiched between first and second ferromagnetic layers wherein one of these layers may comprise several thin films. The first layer is exchange coupled to the antiferromagnetic layer (immediately adjacent thereto) and has its magnetic moment directed in a first direction. The second layer is immediately adjacent the free layer and, even though it is not immediately adjacent the first layer, it is exchange coupled thereto because of the minimal thickness (in the order of 8 Å) of the spacer film therebetween. The magnetic moment of the second layer is oriented in a second direction that is antiparallel to the direction of the magnetic moment of the first layer.

The AP pinned layer is preferred over the single film pinned layer. The magnetic moments of the first and second layers of the AP pinned layer subtractively combine to provide a net pinning moment of the AP pinned layer. The direction of the net moment is determined by the thicker of the first and second layers. The thicknesses of the first and second layers are chosen to provide a low net magnetic moment. A reduced net moment equates to a reduced demagnetization (demag) field from the AP pinned layer. A reduced demag field also reduces the demag field imposed on the free layer which promotes a zero bias point for the operation of the free layer along its transfer curve. Further, since the antiferromagnetic exchange coupling is inversely proportional to the net pinning moment, exchange coupling between the first layer of the AP pinned layer and the pinning layer is increased by lowering the net pinning moment.

The high exchange coupling promotes higher thermal stability of the head. When the head encounters elevated thermal conditions caused by electrostatic discharge (ESD) from an object or person, or by contacting an asperity on a magnetic disk, the blocking temperature of the antiferromagnetic layer can be exceeded, resulting in disorientation of its magnetic spins wherein blocking temperature is the temperature at which the magnetic spins of the antiferromagnetic layer are free to rotate. The magnetic moment of the pinned layer is then no longer pinned in the desired direction. An increase in the exchange coupling decreases the instances of destabilization of the antiferromagnetic layer.

Efforts continue to increase the spin valve effect of GMR heads. An increase in the spin valve effect equates to higher bit density (bits/square inch of the rotating magnetic disk) read by the read head. Promoting read signal symmetry is a major consideration. This is accomplished by reducing the magnetic influences on the free layer. Another concern is reducing diffusion of conduction electrons in the AP pinned spin valve sensor without impacting other factors that are important to the performance of the sensor. It is known that one or more specular reflecting layers of nickel oxide (NiO), silver (Ag) or gold (Au) may be employed at the top and/or the bottom of a simple spin valve sensor for specular reflection of electrons so as to conserve conduction electrons in the spin valve sensor. A spin valve sensor is characterized as a top or bottom spin valve sensor depending upon whether the pinning layer is at the top (formed after the free layer) or at the bottom (formed before the free layer). The aforementioned NiO is also a desirable material for a pinning layer in a bottom spin valve sensor. When a NiO layer is employed at the top of a simple spin valve sensor for specular reflection of electrons the prior art teaches interfacing the NiO layer with a copper layer so that the NiO layer does not exchange couple with the free layer.

SUMMARY OF THE INVENTION

I have found that the ruthenium (Ru) layer in an AP pinned layer is a barrier to conduction electrons which prevents specular reflection of electrons on a side of the AP pinned layer away from the free layer. I have discovered, however, that specular reflection of conduction electrons can be achieved on the opposite side of the AP pinned layer. My invention includes locating a thin specular reflecting layer on the side of the AP pinned layer where the copper spacer layer and the free layer are located. If nickel oxide (NiO) is employed as a specular reflecting layer it may be combined with another specular reflecting layer, such as a copper layer, where the copper layer serves multiple functions, namely: (1) preventing an exchange coupling with the nickel oxide (NiO) layer, (2) biasing the free layer to promote read signal symmetry, (3) increasing the GMR effect on an opposite side of the free layer, and (4) promoting magnetic stability of the AP pinned layer.

In another aspect of the invention I have employed a magnetic layer at the top of the spin valve sensor that functions as a second pinned layer. With this arrangement the specular reflecting layer not only reflects conduction electrons to the first pinned layer but also to the second pinned layer. In an exemplary embodiment, a second copper spacer layer may be sandwiched between the second pinned layer and the free layer and the second pinned layer is located between the second copper spacer layer and a specular reflecting layer. The second pinned layer is pinned by sense current fields from other conductive layers in the spin valve sensor. If the specular reflecting layer is NiO and is exchange coupled to the second pinned layer it is important that the specular reflecting NiO layer be sufficiently thin so that the sense current fields control the pinning of the second pinned layer instead of the specular reflecting NiO layer. Preferably, the specular reflecting NiO layer is separated from the second pinned layer by a specular reflecting copper spacer layer. The sense current is conducted in a selected direction for pinning the second pinned layer in the desired direction. This direction also causes a sense current field from the second pinning layer to enhance pinning of the AP pinned layer. The arrangement may be either a bottom or a top spin valve sensor.

An object of the present invention is to provide an AP pinned spin valve that has an improved GMR effect by specular reflection of conduction electrons.

Another object is to provide an AP pinned spin valve that has specular reflection on conduction electrons to both an AP pinned layer and a second pinned layer.

Other objects and advantages of the present invention will become apparent upon reading the following description taken together with the accompanying drawings.

BRIEF DESCRIPTION OF THE DRAWINGS

FIG. 9 is an ABS view of a present bottom AP pinned spin valve sensor that employs a specular reflecting layer;

FIG. 15 is an ABS illustration of another embodiment of the spin valve sensor;

FIG. 16 is an ABS illustration of a further embodiment of the spin valve sensor;

FIG. 17 is an ABS illustration of still another embodiment of the spin valve sensor; and FIG. 18 is an ABS illustration of still a further embodiment of the spin valve sensor.

DESCRIPTION OF THE PREFERRED EMBODIMENTS

Magnetic Disk Drive

Figure 1:
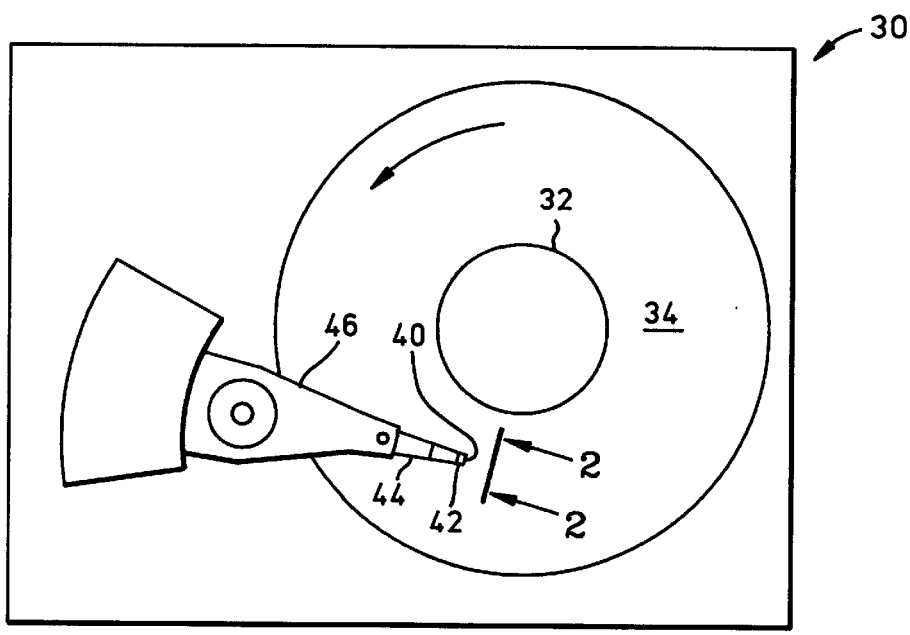
FIG. 1 is a plan view of an exemplary magnetic disk drive.
Figure 2:
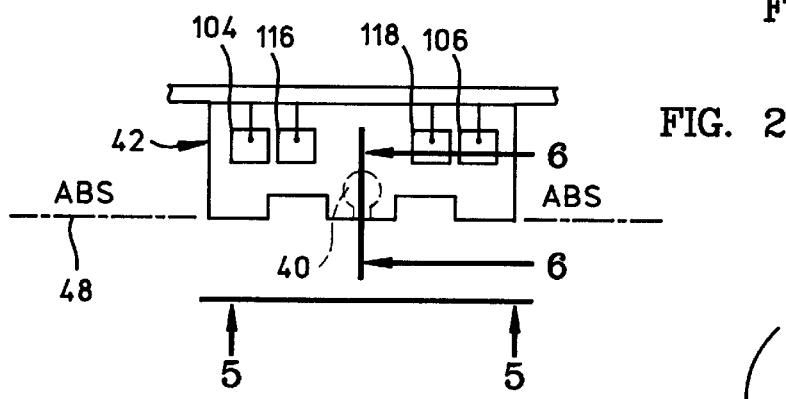
FIG. 2 is an end view of a slider with a magnetic head as seen in plane 2—2 of FIG. 1.
Figure 3:
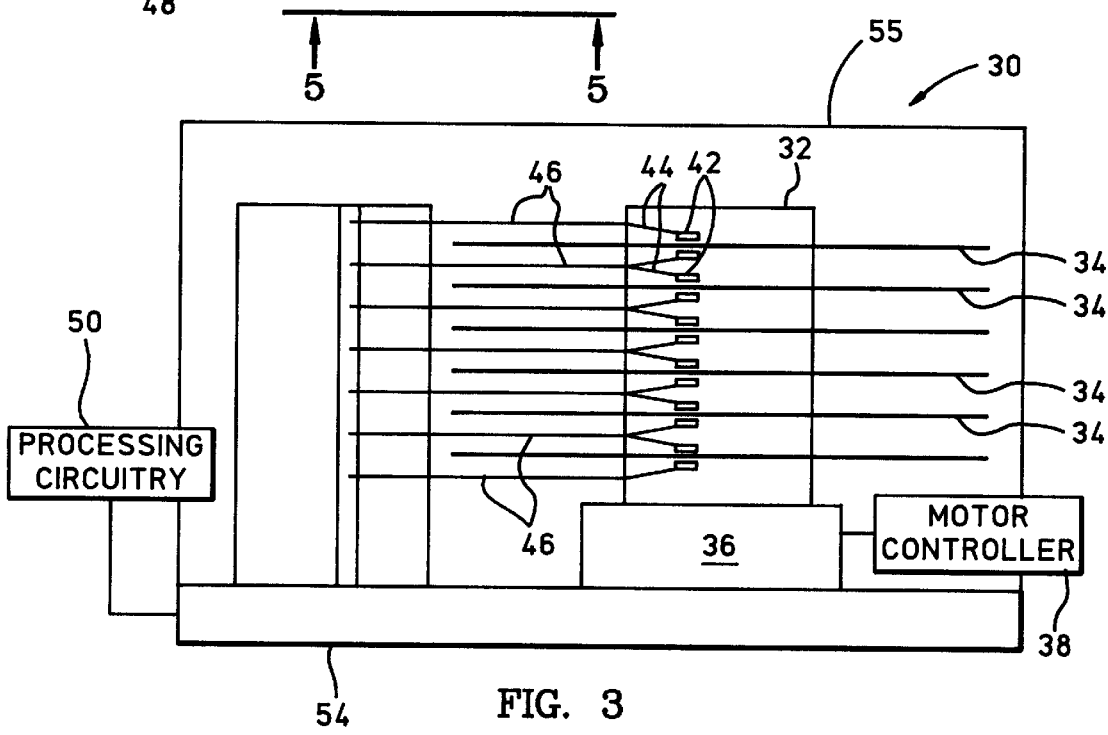
FIG. 3 is an elevation view of the magnetic disk drive wherein multiple disks and magnetic heads are employed.
Figure 4:
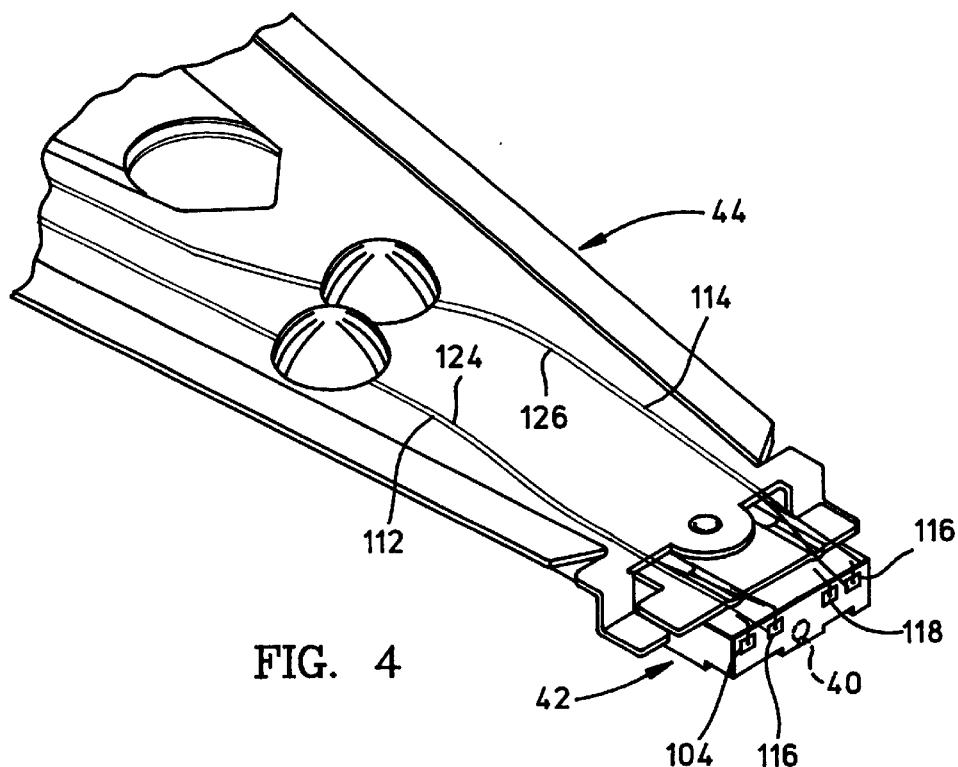
FIG. 4 is an isometric illustration of an exemplary suspension system for supporting the slider and magnetic head.

Referring now to the drawings wherein like reference numerals designate like or similar parts throughout the several views, FIGS. 1–3 illustrate a magnetic disk drive 30. The drive 30 includes a spindle 32 that supports and rotates a magnetic disk 34. The spindle 32 is rotated by a motor 36 that is controlled by a motor controller 38. A combined read and write magnetic head (merged MR head) 40 is mounted on a slider 42 that is supported by a suspension 44 and actuator arm 46. A plurality of disks, sliders and suspensions may be employed in a large capacity direct access storage device (DASD) as shown in FIG. 3. The suspension 44 and actuator arm 46 position the slider 42 so that the magnetic head 40 is in a transducing relationship with a surface of the magnetic disk 34. When the disk 34 is rotated by the motor 36 the slider is supported on a thin (typically, 0.05 µm) cushion of air (air bearing) between the surface of the disk 34 and the air bearing surface (ABS) 48. The magnetic head 40 may then be employed for writing information to multiple circular tracks on the surface of the disk 34, as well as for reading information therefrom. Processing circuitry 50 exchanges signals, representing such information, with the head 40, provides motor drive signals for rotating the magnetic disk 34, and provides control signals for moving the slider to various circular tracks on the disk. FIG. 4 shows the mounting of the slider 42 to the suspension 44, which will be described hereinafter. The components described hereinabove may be mounted on a frame 54 of a housing 55, as shown in FIG. 3.

Figure 5:
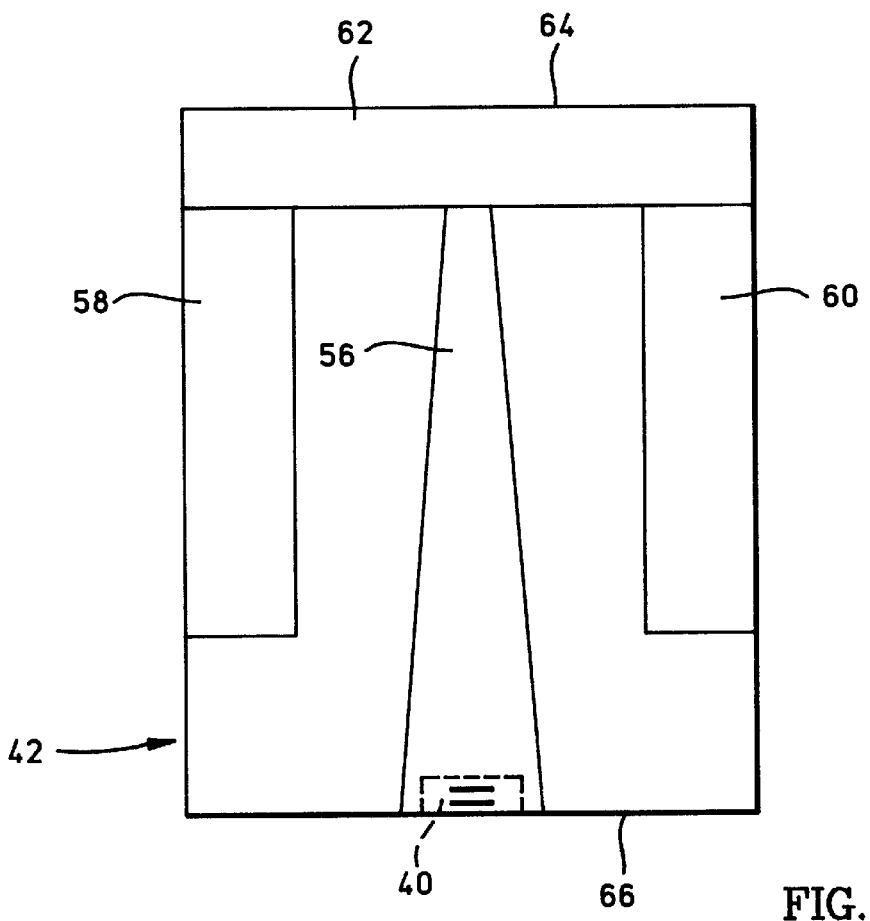
FIG. 5 is an ABS view of the magnetic head taken along in plane 5—5 of FIG. 2.

FIG. 5 is an ABS view of the slider 42 and the magnetic head 40. The slider has a center rail 56 that supports the magnetic head 40, and side rails 58 and 60. The rails 56, 58 and 60 extend from a cross rail 62. With respect to rotation of the magnetic disk 34, the cross rail 62 is at a leading edge 64 of the slider and the magnetic head 40 is at a trailing edge 66 of the slider.

Figure 6:
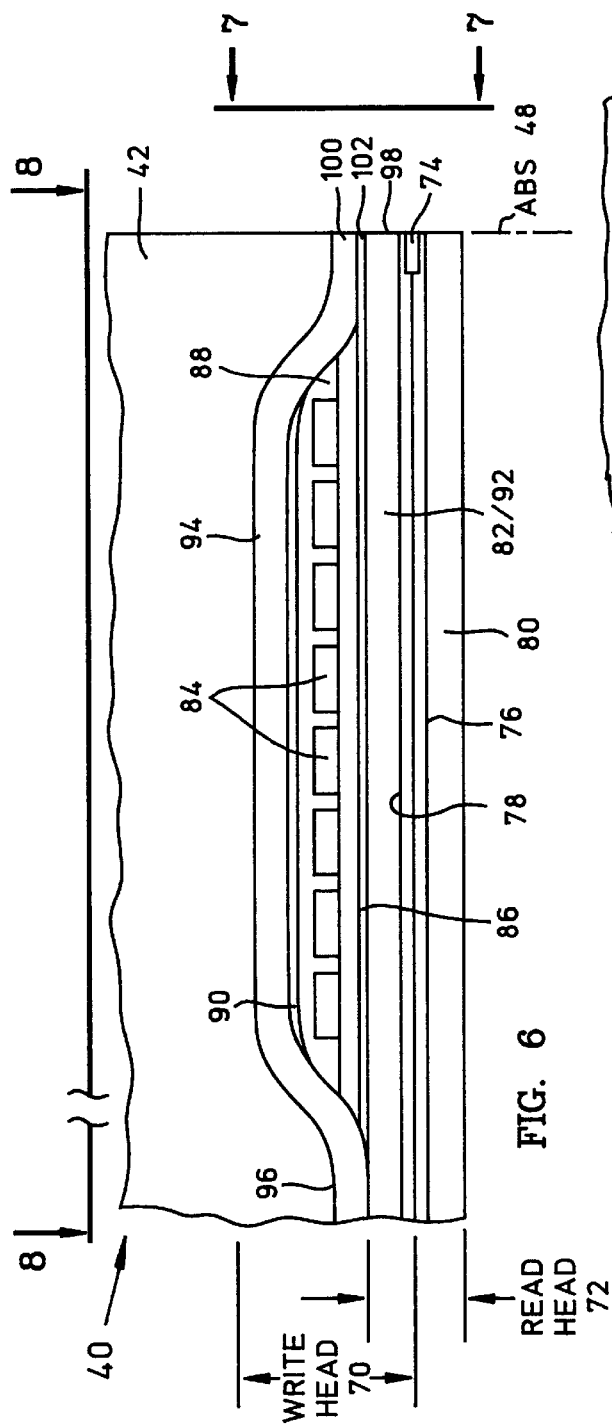
FIG. 6 is a front portion of the magnetic head as seen in plane 6—6 of FIG. 2.
Figure 7:
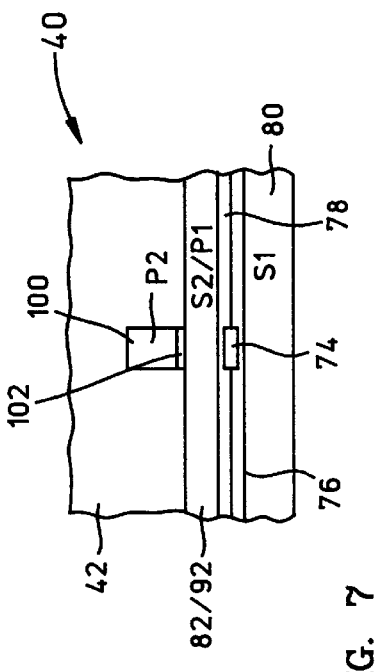
FIG. 7 is a partial ABS view of the slider taken along plane 7—7 of FIG. 6 to show the read and write elements of the magnetic head.

FIG. 6 is a side cross-sectional elevation view of a front portion of the merged MR head 40, which includes a write head portion 70 and a read head portion 72, the read head portion employing an AP pinned spin valve sensor 74 of the present invention. FIG. 7 is an ABS view of FIG. 6. The spin valve sensor 74 is sandwiched between first and second gap layers 76 and 78, and the gap layers are sandwiched between first and second shield layers 80 and 82. In response to external magnetic fields from the rotating disk, the resistance of the spin valve sensor 74 changes. A sense current Is (see FIG. 12) conducted through the sensor causes these resistance changes to be manifested as potential changes. These potential changes are then processed as readback signals by the processing circuitry 50 shown in FIG. 3. The write head portion of the merged MR head includes a coil layer 84 sandwiched between first and second insulation layers 86 and 88. A third insulation layer 90 may be employed for planarizing the head to eliminate ripples in the second insulation layer caused by the coil layer 84. The first, second and third insulation layers are referred to in the art as an "insulation stack". The coil layer 84 and the first, second and third insulation layers 86, 88 and 90 are sandwiched between first and second pole piece layers 92 and 94. The first and second pole piece layers 92 and 94 are magnetically coupled at a back gap 96 and have first and second pole tips 98 and 100 which are separated by a write gap layer 102 at the ABS.

Figure 8:
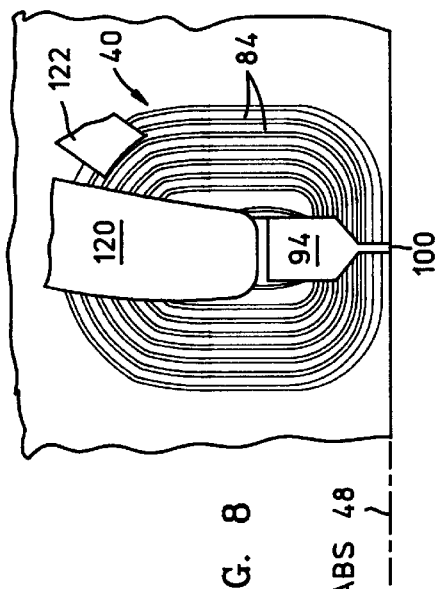
FIG. 8 is a view taken along plane 8—8 of FIG. 6 with all material above the first insulation layer 86 removed except the coil layer and its leads.

As shown in FIGS. 2 and 4, first and second solder connections 104 and 116 connect leads from the spin valve sensor 74 to leads 112 and 124 on the suspension 44, and third and fourth solder connections 118 and 116 connect leads 120 and 122 from the coil 84 (see FIG. 8) to leads 126 and 114 on the suspension.

The Invention

Figure 10:
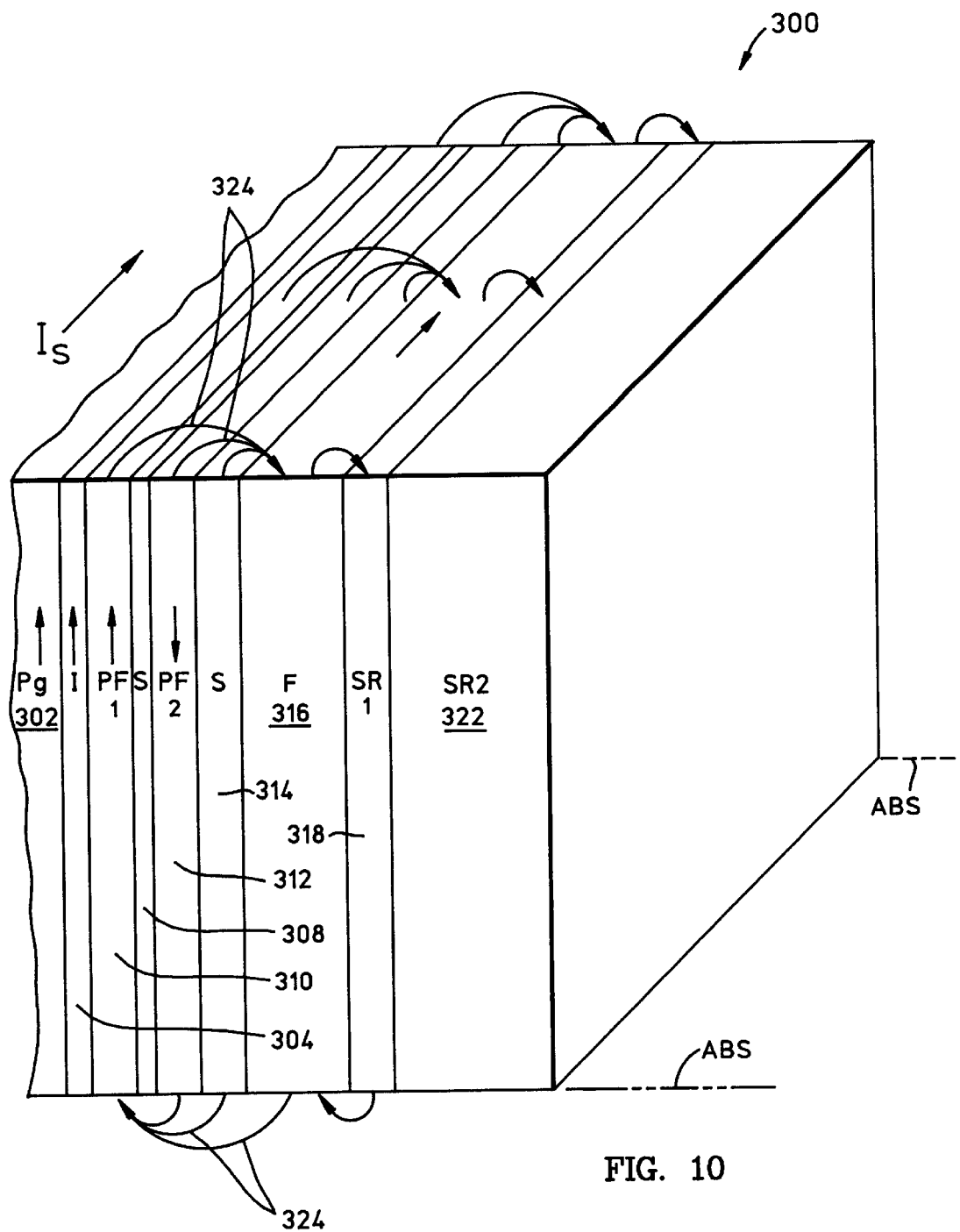
FIG. 10 is an isometric illustration of the spin valve sensor in FIG. 9.

The present spin valve sensor 300 in FIGS. 9 and 10 is a bottom spin valve sensor since a pinning layer (PG) 302 is employed at the bottom of the sensor. This pinning layer was nickel oxide (NiO) with a thickness of 400 Å. The AP pinned layer 306, which is a first pinned layer, includes a spacer layer (S) 308 which is located between a first pinned layer, which includes an interface film (I) 304 and a first pinned film (PF1) 310, and a second pinned film (PF2) 312. The interface film (I) 304 was 10 Å of nickel iron (NiFe), the first pinned film 310 was 24 Å of cobalt (Co), the spacer film 308 was 6 Å of ruthenium (Ru) and the second pinned film was 24 Å of Co. The interface film (I) 304 is exchange coupled to the pinning layer 302, the first pinned film 310 is exchange coupled to the interface layer 304 and the second pinned film 312 is strongly exchange coupled to the first pinned film 310 via the spacer film 308. The reason for the interface layer 304 is that a NiO pinning layer 302 has a stronger exchange coupling with a NiFe interface layer 304 than it does with a Co first pinned film layer 310. Because of the spacer layer film 308 the magnetic moment of the second pinned film 312 is antiparallel to the magnetic moment of the first pinned film 310. Accordingly, the magnetic moments of the interface film 304 and the first pinned film 310 will face in one direction while the magnetic moment of the second pinned film 312 faces in an opposite direction.

A spacer layer (S) 314 is located between the second pinned film 312 and the free layer 316. The spacer layer 314 may be 20 Å of copper and the free layer 316 may be 45 Å of NiFe. A first specular reflecting copper (Cu) layer (SR1) 318 is located between the free layer 316 and a second specular reflecting (SR2) nickel oxide (NiO) layer. The layer 318 may be 20 Å of copper and the layer 316 may be 100 Å of nickel oxide (NiO). The specular reflecting layers 318 and 322 reflect conduction electrons to the AP pinned layer 306 thereby increasing the spin valve effect of the sensor.

In FIG. 10 the orientation of the magnetic spins of the pinning layer 302 may be in an upward direction perpendicular to the ABS. A sense current $I_s$ is conducted through the sensor, as shown, which causes sense current fields 324. By exchange coupling, the pinning layer 302 pins the magnetic moment of the interface layer 304 in the upward direction and, by exchange coupling, the interface film 304 pins the magnetic moment of the first pinned film 310 in the upward direction. A sense current field from the second spacer layer 318 further pins the magnetic moment of the first pinned film 310 in the upward direction as shown. It should be noted that the sense current field from the first specular reflecting layer 318 counterbalances, to some extent, the sense current fields from the spacer layer 314, the second pinned film 312, the spacer film 308, the first pinned film 310 and the interface film 304 on the free layer 316. Accordingly, the sense current field from the first specular reflecting layer 318 will promote read signal symmetry of the sensor 300. Further, both specular reflecting layers 318 and 322 reflect conduction electrons so as to further enhance the spin valve effect of the sensor 300.

Figure 11:
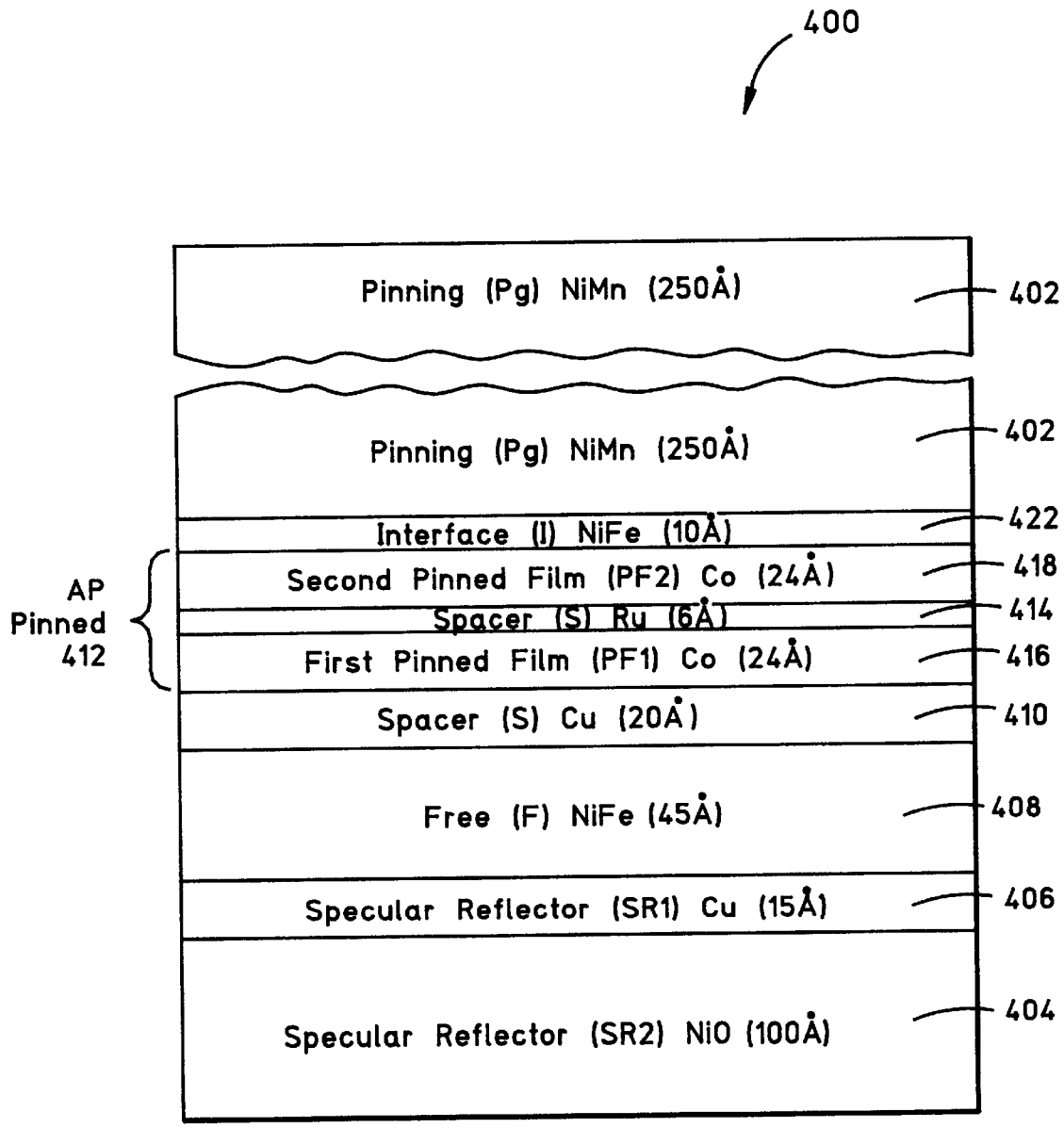
FIG. 11 is an ABS view of a present top AP pinned spin valve sensor that employs a specular reflecting layer.
Figure 12:
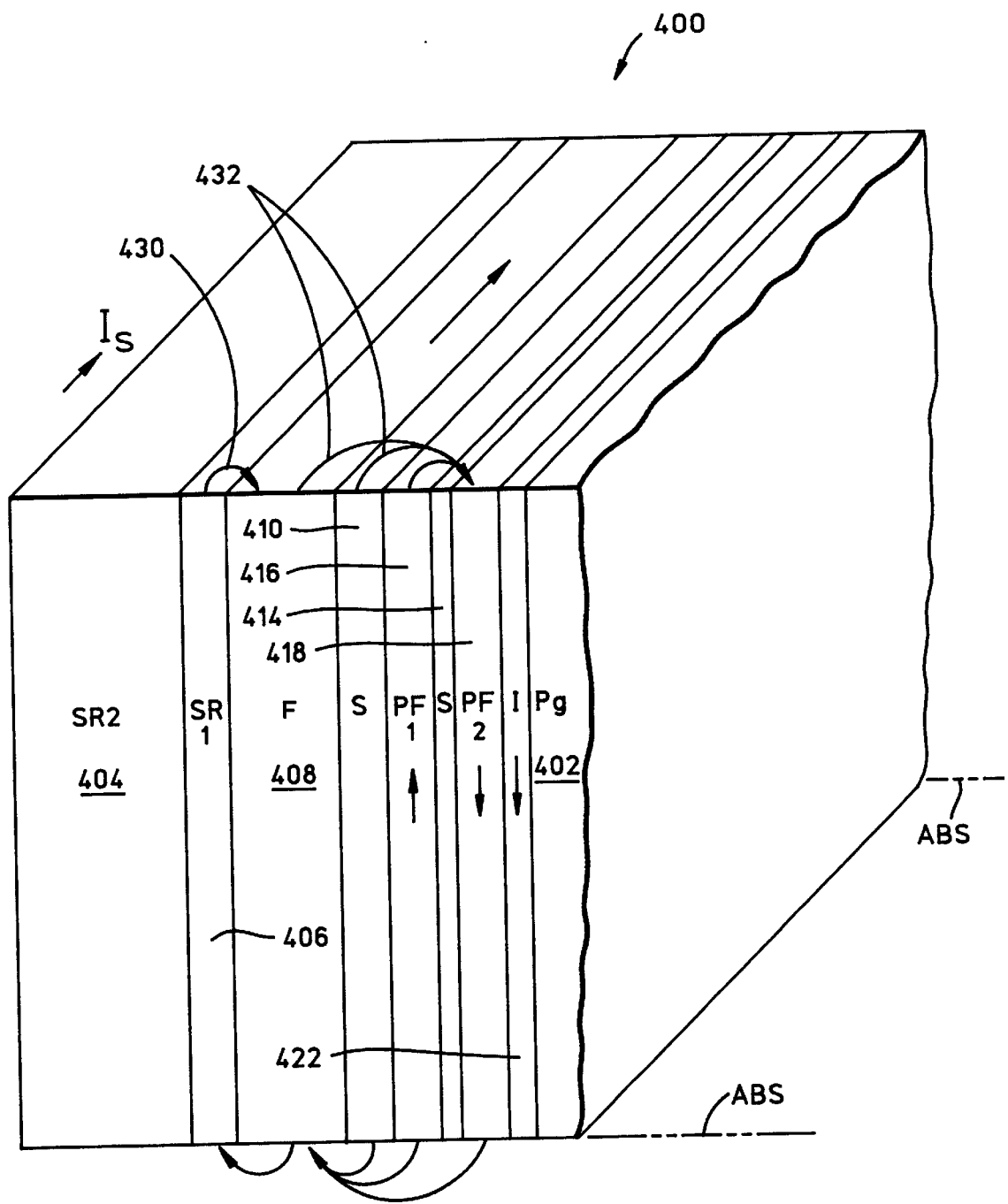
FIG. 12 is an isometric illustration of the spin valve sensor in FIG. 11.

FIGS. 11 and 12 illustrate a top spin valve sensor 400 which employs the present invention. In the top spin valve sensor the pinning layer 402 is located at the top of the spin valve and the specular reflecting layers (SR1) 406 and (SR2) 404 are located at the bottom of the spin valve. On top of the specular reflector layer 406 is a free layer 408 which may be 45 Å of nickel iron (NiFe). The magnetic moment of the free layer 408 is free to rotate from a generally parallel position to the ABS in response to magnetic fields from a rotating magnetic disk. A spacer layer (S) 410 is located on the free layer 408 and may be 20 Å of copper (Cu). An AP pinned layer 412 is located on the spacer layer 410 and includes a ruthenium (Ru) spacer (S) film 414 which is located between first and second pinned films (PF1) and (PF2) 416 and 418, each of which may be 24 Å of cobalt (Co). On the AP pinned layer 412 is an antiferromagnetic pinning (PG) layer 420 which may be 250 Å of nickel manganese (NiMn), iridium manganese (IrMn) or platinum manganese (PtMn). The pinning layer 402 is exchange coupled to the first pinned film 418 which causes the magnetic moment of the first pinned film to be in one direction perpendicular to the ABS and the first pinned film 416 causes the second pinned film 418 to be in an antiparallel position with respect to the ABS because of the antiferromagnetic coupling across the ruthenium (Ru) spacer layer 414. Optionally, the AP pinned layer 412 may include an interface (I) layer 422 between the first pinned film 416 and the pinning layer 402. The interface (I) layer 422 is preferably nickel iron (NiFe) and may be 10 Å thick. The purpose of the nickel iron (NiFe) layer 422 is to make a better exchange coupling with the pinning layer 402 than a cobalt first pinned film 416.

With the sense current $I_s$, as shown in FIG. 12, the magnetic spins of the pinning layer 402 are oriented to cause the magnetic moment of the interface layer 422 to be directed, in a downward direction, as shown. By exchange coupling the first pinned film 416 of the AP pinned layer is likewise directed in a downward direction. This causes the magnetic moment of the second pinned film 418 to be directed in the upward direction, as shown. Sense current fields from the first specular reflecting layer 406, the free layer 408, the spacer layer 410 and the second pinned film 418 are additive to direct the magnetic moment of the first pinned film 416 in a downward direction so as to stabilize the operation of the AP pinned layer. A sense current field 430 from the first specular reflecting layer 406 will aid in counterbalancing sense current fields 432 from the layers 410, 416, 414 and 418 on the free layer 408 so as to promote read signal symmetry. The specular reflecting layers 406 and 404 will reflect sense current conduction electrons to the layers 408, 410 and 416.

Figure 13:
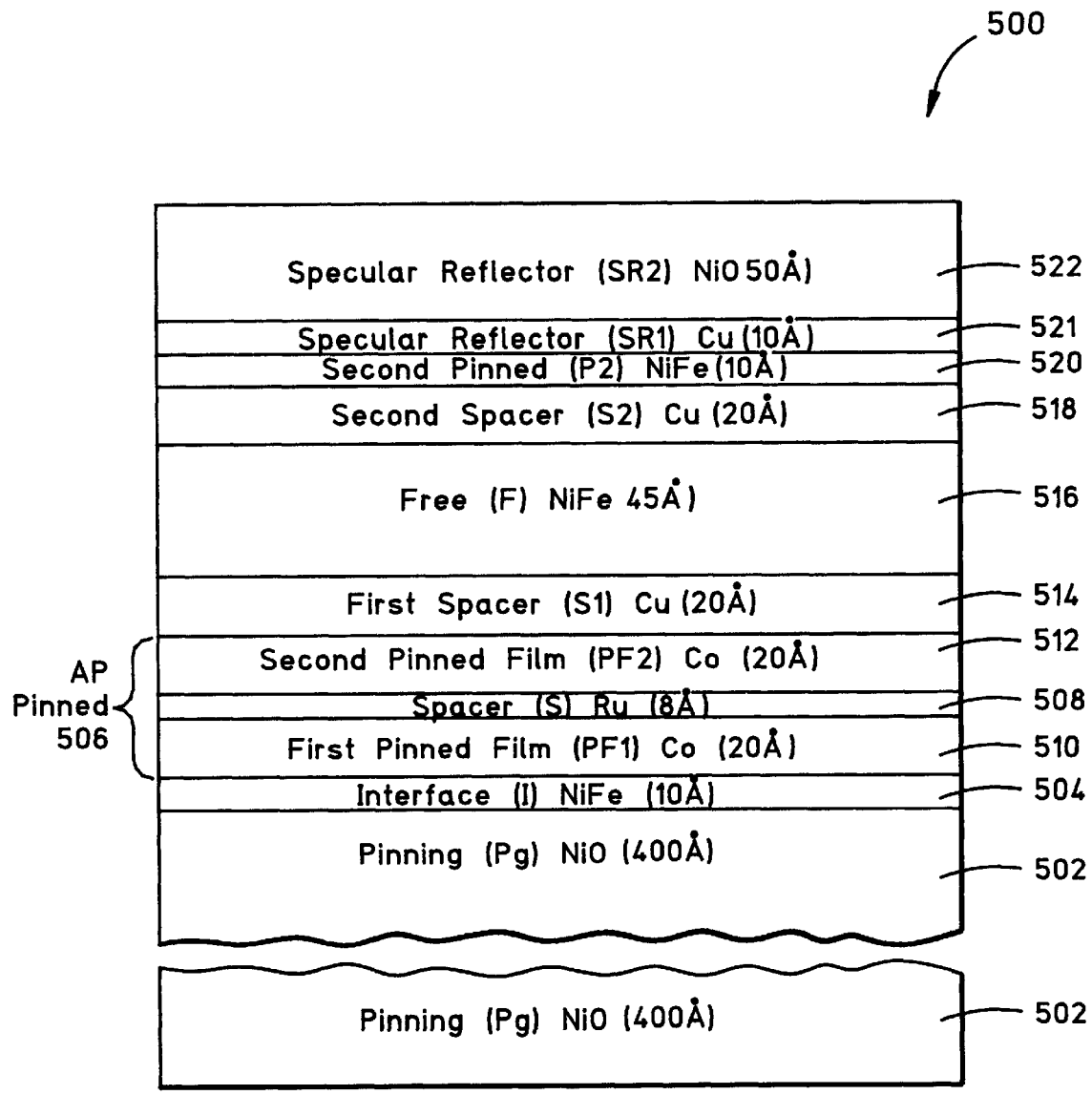
FIG. 13 is an ABS illustration of the present AP pinned spin valve sensor employing a second pinned layer.
Figure 14:
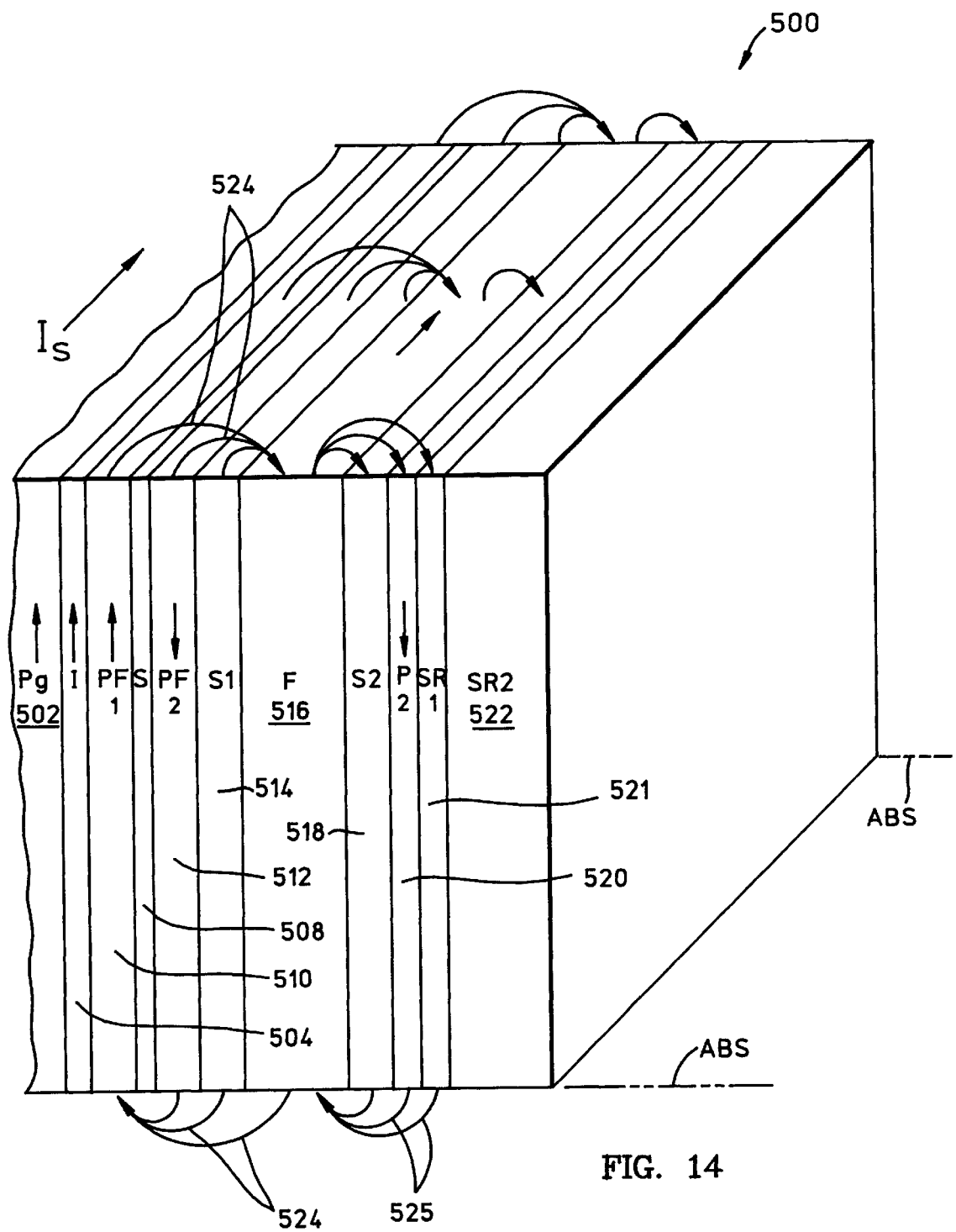
FIG. 14 is an isometric illustration of the spin valve sensor in FIG. 13.

In FIGS. 13 and 14 a bottom AP pinned valve sensor 500 with a second pinned layer and specular reflection of conduction electrons to both the AP pinned layer and the second pinned layer is shown. This pinning layer 502 is nickel oxide (NiO) with a thickness of 400 Å. The AP pinned layer 506, which is a first pinned layer, includes a spacer film (S) 508 which is located between a first pinned layer, which includes an interface film (I) 504 and a first pinned film (PF 1) 510, and a second pinned film (PF2) 512. The interface film (I) 504 may be 10 Å of nickel iron (NiFe), the first pinned film 510 may be 20 Å of cobalt (Co), the spacer film 508 may be 8 Å of ruthenium (Ru) and the second pinned film may be 20 Å of Co. The interface film (I) 504 is exchange coupled to the pinning layer 502, the first pinned film 510 is exchange coupled to the interface layer 504 and the second pinned film 512 is exchange coupled to the first pinned film 510 via the spacer film 508. The reason for the interface layer 504 is that a NiO pinning layer 502 has a stronger exchange coupling with a NiFe interface layer 504 than it does with a Co first pinned film layer 510. Because of the spacer film 508 the magnetic moment of the second pinned film 512 is antiparallel to the magnetic moment of the first pinned film 510. Accordingly, the magnetic moments of the interface film 504 and the first pinned film 510 will face in one direction while the magnetic moment of the second pinned film 512 faces in an opposite direction.

A first spacer layer (S1) 514 is located between the second pinned film 512 and the free layer 516. The first spacer layer 514 may be 20 Å of copper and the free layer 516 may be 45 Å of NiFe. A second spacer layer 518 is located between the free layer 516 and a second pinned layer (P2) 520. The second spacer layer 518 may be 20 Å of copper and the second pinned layer 520 may be 10 Å of NiFe. The second specular reflector layer 522, which will be discussed in more detail hereinbelow, may be 50 Å of NiO. A first specular reflecting layer (SR1) 521 may be located between the second pinned layer 520 and a second specular reflector layer (SR2) 522 for the purpose of preventing an exchange coupling between the second specular reflecting layer 522 and the second pinned layer 520. It is important that the magnetic moments of the second pinned film 512 and the second pinned layer 520 be in the same direction for the purpose of enhancing the spin valve effect.

In FIG. 14 the orientation of the magnetic spins of the pinning layer 502 may be in an upward direction perpendicular to the ABS. A sense current $I_s$ is conducted through the sensor, as shown, which causes sense current fields 524. By exchange coupling, the pinning layer 502 pins the magnetic moment of the interface layer 504 in the upward direction and, by exchange coupling, the interface film 504 pins the magnetic moment of the first pinned film 510 in the upward direction. Sense current fields from the second spacer layer 518 and the second pinned layer 520 further pin the magnetic moment of the first pinned film 510 in the upward direction as shown. Sense current fields from the first spacer layer 514, the second pinned film 512, the first pinned film 510 and the interface film 504 are employed for pinning the magnetic moment of the second pinned layer 520 in the downward direction, as shown. The orientation of the magnetic spins of the specular reflector layer 522 is in the upward direction. If the first specular reflecting layer 521 is omitted the thickness of the second specular reflecting layer 522 should be sufficiently thin (50 Å) so that the magnetic moment of the second pinned layer 520 is controlled by sense current fields rather than by exchange coupling with the specular reflecting layer 522. It should be noted that the sense current fields 525 from the second spacer layer 518, the second pinned layer 520 and the first specular reflecting layer 521 oppose the magnetic moment of the second pinned film 512. However, because of the strong exchange coupling between the first and second pinned films 510 and 512, these sense current fields are overcome to pin the magnetic moment of the pinned film 512 in the downward direction. Accordingly, the magnetic moments of the second pinned film 512 and the second pinned layer 520 are both strongly pinned in the downward direction perpendicular to the ABS so that the spin valve effect with respect to the free layer 516 is increased to enhance the ΔR/R of the sensor 500. The sensor also has the advantage that the sense current fields 525 counterbalance, to some extent, the sense current fields 524 on the free layer 516. Accordingly, the sense current fields from the layers 518, 520 and 521 will promote read signal symmetry of the sensor 500. Further, the specular reflecting layers 521 and 522 reflect conduction electrons so as to further enhance the spin valve effect of the sensor 500.

Other materials suitable for the second pinned layer 520 are nickel iron cobalt (NiFeCo), cobalt (Co), or cobalt iron (CoFe). It should be noted that if the second pinned layer 520 is too thick the specular reflecting layers 521 and 522 will not reflect conduction electrons. Accordingly, this layer should be less than 20 Å. Further, when the second pinned layer 520 is too thick it may be more difficult to pin its magnetic moment by sense current fields from the other layers. If the first specular reflecting layer 521 is omitted it is important that the thickness of the specular reflecting layer 522 be thin enough so that it does not control the magnetic moment of the second pinned layer 520. Without the layer 521 the thickness of the specular reflector layer 522 should be in a range from 25 Å to 250 Å. By making the thickness of the interface film 504 small a better exchange coupling is implemented with the NiO pinning layer 502. Further, by keeping the thickness of the interface film 504 small the net magnetic moment of the AP pinned layer 306 (see FIG. 13) is small. This is important from the standpoint that the magnitude of the exchange coupling between the interface film 504 and the pinning layer 502 is proportional to the net magnetic thickness or magnetic moment of the AP pinned layer 506. Accordingly, the interface film 504 should have a thickness in the range of 8 Å to 15 Å. It should be noted that the pinned layer 502 may be other antiferromagnetic materials, such as nickel manganese (NiMn), iridium manganese (IrMn) or platinum chromium (PtCr). The other layers of the sensor 500 should be kept as thin as possible so as to decrease the magnetic gap of the read sensor and promote linear reading density of the read head.

FIG. 15 is an ABS illustration of a first modification of the spin valve sensor shown in FIG. 9. In FIG. 15 a single specular reflector (SR) made of copper (Cu), silver (Ag) or gold (Au) is employed. In a preferred embodiment a single specular reflector layer of copper (Cu) 15 Å thick is employed with a capping layer (not shown), such as tantalum (Ta). In FIG., 16 there is shown a second embodiment of the spin valve sensor shown in FIG. 9. In this embodiment a first specular reflector (SR1) of copper (Cu), silver (Ag) or gold (Au) 318 is located on the free layer 316. A second specular reflector (SR2) of nickel oxide (NiO) 100 Å thick 322 is located on the first specular reflector 318. In a preferred embodiment the first specular reflector is 15 Å of copper (Cu).

A third modification of the spin valve sensor shown in FIG. 9 is shown in FIG. 17. A first specular reflector layer (SR1) 318 of copper (Cu) 15 Å thick is located on the free layer 316. A second reflector layer (SR2) 319 of silver (Ag) or gold (Au) is located on the first specular reflector layer 318. A capping layer (not shown) of tantalum (Ta) may be located on the second specular reflector layer 319. FIG. 18 is a fourth modification of the spin valve sensor shown in FIG. 9. A first specular reflector (SRI) 318 of copper (Cu) 15 Å thick is located on the free layer 316. A second specular reflector (SR2) of silver (Ag) or gold (Au) 319 is located on the first specular reflector 318. A third specular reflector (SR3) of nickel oxide (NiO) 100 Å thick is located on the second specular reflector 319. If desired, a capping layer (not shown) may be located on third specular reflector 322.

Clearly, other embodiments and modifications of this invention will occur readily to those of ordinary skill in the art in view of these teachings. Therefore, this invention is to be limited only by following claims, which include all such embodiments and modifications when viewed in conjunction with the above specification and accompanying drawings.

What is claimed is:

1. A method of making a spin valve sensor that has an air bearing surface (ABS) comprising the steps of:
    forming an antiferromagnetic pinning layer that has magnetic spins oriented in a first predetermined direction;
    forming an antiparallel (AP) pinned layer exchange coupled to the pinning layer so that a magnetic moment of the AP pinned layer is pinned in a second predetermined direction that is antiparallel to said first predetermined direction;
    forming a nonmagnetic electrically conductive first spacer layer on the AP pinned layer;
    forming a ferromagnetic free layer on the first spacer layer that has a magnetic moment that is free to rotate relative to the second predetermined direction in response to an applied magnetic field;
    forming first and second specular reflector layers interfacing each other and located on a side of the free layer opposite the spacer layer;
    forming the free layer between the spacer layer and the first specular reflector layer and forming the first specular reflector layer between the free layer and the second specular reflector layer;
    selecting the first specular reflector layer from the group consisting of copper (Cu), gold (Au) and silver (Ag); and
    forming the second specular reflector layer of a metallic oxide.

2. A method as claimed in claim 1 further comprising the step of forming the first specular reflector layer of copper (Cu).

3. A method as claimed in claim 2 further comprising the step of forming the second specular reflector layer of nickel oxide (NiO).

4. A method as claimed in claim 3 further comprising the step of forming the pinning layer of nickel oxide (NiO) with a thickness from 375 Å to 475 Å.

5. A method as claimed in claim 3 further comprising the step of selecting the pinning layer from the group consisting of NiMn, IrMn and PtMn.

6. A method as claimed in claim 1 further comprising the steps of:
    forming a nonmagnetic second spacer layer on the free layer;
    forming a ferromagnetic pinned layer on the second spacer layer that has a magnetic moment that can be pinned in a direction parallel to said second predetermined direction by a sense current field from other conductive layers of the spin valve sensor; and
    forming the first specular reflector layer between the ferromagnetic pinned layer and the second specular reflector layer.

7. A method as claimed in claim 6 further comprising the step of forming the first specular reflector layer of copper (Cu).

8. A method as claimed in claim 7 further comprising the step of forming the second specular reflector layer of nickel oxide (NiO).

9. A method as claimed in claim 8 further comprising the step of selecting the ferromagnetic pinned layer from the group consisting of NiFe, NiFeCo, Co and CoFe.

10. A method as claimed in claim 9 further comprising the step of forming the ferromagnetic pinned layer with a thickness from 5 Å to 20 Å.

11. A method of making a magnetic head that has an air bearing surface (ABS) comprising the steps of:
    forming a read head that includes:
        forming a ferromagnetic first shield layer;
        forming a nonmagnetic electrically insulative first gap layer on the first shield layer;
        forming a spin valve sensor on the first gap layer comprising the steps of:
            forming an antiferromagnetic pinning layer that has magnetic spins oriented in a first predetermined direction;
            forming an antiparallel (AP) pinned layer exchange coupled to the pinning layer so that a magnetic moment of the AP pinned layer is pinned in a second predetermined direction that is antiparallel to said first predetermined direction;
            forming a nonmagnetic electrically conductive first spacer layer on the AP pinned layer;
            forming a ferromagnetic free layer on the first spacer layer that has a magnetic moment that is free to rotate relative to the second predetermined direction in response to an applied magnetic field;
            forming first and second specular reflector layers interfacing each other and located on a side of the free layer opposite the spacer layer;
            forming the free layer between the spacer layer and the first specular reflector layer and forming the first specular reflector layer between the free layer and the second specular reflector layer;
            selecting the first specular reflector layer from the group consisting of copper (Cu), gold (Au) and silver (Ag); and
            forming the second specular reflector layer of a metallic oxide;
        forming first and second electrically conductive lead layers that are on the first gap layer and connected to the sensor;
        forming a nonmagnetic electrically insulative second gap layer on the sensor, the lead layers and the first gap layer; and
        forming a ferromagnetic second shield layer on the second gap layer;
    forming a write head as follows:
        forming a write gap layer and an insulation stack with a coil layer embedded therein on the second shield layer so that the second shield layer also functions as a first pole piece for the write head; and forming a second pole piece on the insulation stack and the write gap and connected at a back gap to the first pole piece.

12. A method as claimed in claim 11 further comprising the step of forming the first specular reflector layer of copper (Cu).

13. A method as claimed in claim 12 further comprising the step of forming the second specular reflector layer of nickel oxide (NiO).

14. A method as claimed in claim 13 further comprising the step of forming the pinning layer of nickel oxide (NiO).

15. A method as claimed in claim 12 further comprising the step of forming the second specular reflector layer of silver (Ag) or gold (Au).

16. A method as claimed in claim 15 further comprising the steps of:

forming the second specular reflector layer of silver (Ag) or gold (Au); and forming a third specular reflector layer of nickel oxide (NiO) with the second specular reflector layer being located between the first and third specular reflector layers.

17. A method as claimed in claim 12 further comprising the steps of:

forming a nonmagnetic second spacer layer on the free layer;

forming a ferromagnetic pinned layer on the second spacer layer that has a magnetic moment that can be pinned in a direction parallel to said second predetermined direction by a sense current field from other conductive layers of the spin valve sensor; and forming the first specular reflector layer on the pinned layer.

18. A method as claimed in claim 17 further comprising the step of forming the second specular reflector layer of nickel oxide (NiO).

19. A method as claimed in claim 18 further comprising the step of forming the pinned layer of nickel oxide (NiO).

20. A method of making a magnetic read head comprising the steps of:

forming a read head comprising the steps of:
forming a ferromagnetic first shield layer;
forming a nonmagnetic electrically insulative first gap layer on the first shield layer;
forming a spin valve sensor on the first gap layer as follows:
forming a nonmagnetic electrically conductive first spacer layer on the specular reflecting NiO layer;

forming a ferromagnetic free layer on the first gap layer that has a magnetic moment that is free to rotate with respect to a first predetermined direction;

forming a nonmagnetic electrically conductive spacer layer on the free layer;

forming an antiparallel (AP) pinned layer structure on the spacer layer that has a magnetic moment;

forming an antiferromagnetic layer on the AP pinned layer for pinning the magnetic moment of the AP pinned layer in a second predetermined direction;

forming first and second specular reflector layers interfacing each other and located on a side of the free layer opposite the spacer layer;

forming the free layer between the spacer layer and the first specular reflector layer and forming the first specular reflector layer between the free layer and the second specular reflector layer;

selecting the first specular reflector layer from the group consisting of copper (Cu), gold (Au) and silver (Ag); and forming the second specular reflector layer of a metallic oxide;

forming first and second electrically conductive lead layers that are on the first gap layer and connected to the sensor;

forming a nonmagnetic electrically insulative second gap layer on the sensor, the leads and the first gap layer; and forming a ferromagnetic second shield layer on the second gap layer.

21. A method as claimed in claim 20 further comprising the step of forming the first specular reflector layer of copper (Cu).

22. A method as claimed in claim 21 further comprising the step of forming the specular reflector layer of nickel oxide (NiO).

23. A method as claimed in claim 22 further comprising the step of forming the pinning layer of nickel oxide (NiO).

24. A method as claimed in claim 21 further comprising the step of forming the second specular reflector layer of silver (Ag) or gold (Au).

25. A method as claimed in claim 24 further comprising the steps of:

forming the second specular reflector layer of silver (Ag) or gold (Au); and forming a third specular reflector layer of nickel oxide (NiO) with the second specular reflector layer being located between the first and third specular reflector layers.

* * * * *